US007114959B2

(12) United States Patent
Stone et al.

(10) Patent No.: US 7,114,959 B2
(45) Date of Patent: Oct. 3, 2006

(54) LAND GRID ARRAY WITH SOCKET PLATE

(75) Inventors: Brent S. Stone, Chandler, AZ (US); Joel A. Auernheimer, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/925,451

(22) Filed: Aug. 25, 2004

(65) Prior Publication Data

US 2006/0046527 A1 Mar. 2, 2006

(51) Int. Cl.
*H01R 12/00* (2006.01)
*H05K 1/00* (2006.01)

(52) U.S. Cl. .......................................... 439/66; 439/70

(58) Field of Classification Search ............ 439/65–66, 439/70–71, 73–75

See application file for complete search history.

(56) References Cited

U.S. PATENT DOCUMENTS

| | | | | |
|---|---|---|---|---|
| 5,481,436 | A * | 1/1996 | Werther | 361/784 |
| 5,518,410 | A * | 5/1996 | Masami | 439/71 |
| 5,536,181 | A * | 7/1996 | Karnavas | 439/381 |
| 6,561,820 | B1 | 5/2003 | Stone et al. | 439/70 |
| 6,776,624 | B1 * | 8/2004 | Suematsu | 439/71 |
| 6,791,171 | B1 * | 9/2004 | Mok et al. | 257/678 |
| 2004/0253845 | A1 * | 12/2004 | Brown et al. | 439/66 |

* cited by examiner

*Primary Examiner*—Michael C. Zarroli
(74) *Attorney, Agent, or Firm*—Trop, Pruner & Hu, P.C.

(57) ABSTRACT

A grounded conductive plate in a land grid array package assembly includes a plurality of openings. The openings allow contacts from the socket to pass through to contact a package. The diameter of each opening is customizable to produce desired impedance between the contacts and the conductive plate. Impedance discontinuity seen by signals passing through the socket may be reduced.

35 Claims, 2 Drawing Sheets

LAND GRID ARRAY WITH SOCKET PLATE

BACKGROUND

This invention relates generally to sockets for electronic device packages.

Electronic devices are operating at faster and faster speeds. With this increase in performance, a designer should take into consideration the possibility of increased noise, cross-talk, ringing, etc. that may occur on the signal lines of the electronic device.

Electronic devices may reside in any of a number of package technologies, for examples, flat pack, dual in-line package (DIP), pin grid array (PGA), and land grid array (LGA). Electronic devices such as microprocessors generally reside on packages with multiple pins such as an LGA.

Current LGA socket technology has inherent I/O performance limitations. Manufacturing capability limitations of LGA socket technology limit minimum socket height, socket self inductance, socket loop inductance, and socket capacitance. These aspects of the socket design impose impedance discontinuities that limit the performance (i.e., speed) of I/O signaling in electronic device products that use present LGA socket technology.

Currently, these problems have been addressed by reducing socket height, controlling pitch, optimizing mold material, and optimizing the land configuration. However, these solutions have limitations. For example, regarding socket height, the height of the socket can only go so small to control inductance. Similarly, land pitch can only control inductance to a certain degree. Moreover, to reduce impedance discontinuities with land configuration, one may have to completely surround a signal land with ground lands. This requires too many lands to practically use a socket for a microprocessor application.

At high frequencies, impedance (Zo) is equal to the square root of inductance divided by capacitance (Zo=(SQRT L)/C). Current solutions attempt to control the impedance by controlling the inductance (L). In current solutions however, the inductance is generally too high, or the inductance to capacitance ratio is not controlled to the degree desired. Therefore, when an electronic device in a LGA package, for example, is plugged into a socket, signals on the lands of the LGA package see impedance discontinuities causing signal integrity problems.

Thus, there is a need for better LGA packages.

DETAILED DESCRIPTION

A grounded metal plate may be embedded within a land grid array (LGA) electronic socket. The plate may provide a balancing capacitance that compensates for the inductance of the socket, reducing the discontinuity presented by the socket interconnect elements in some embodiments.

Figure 1:
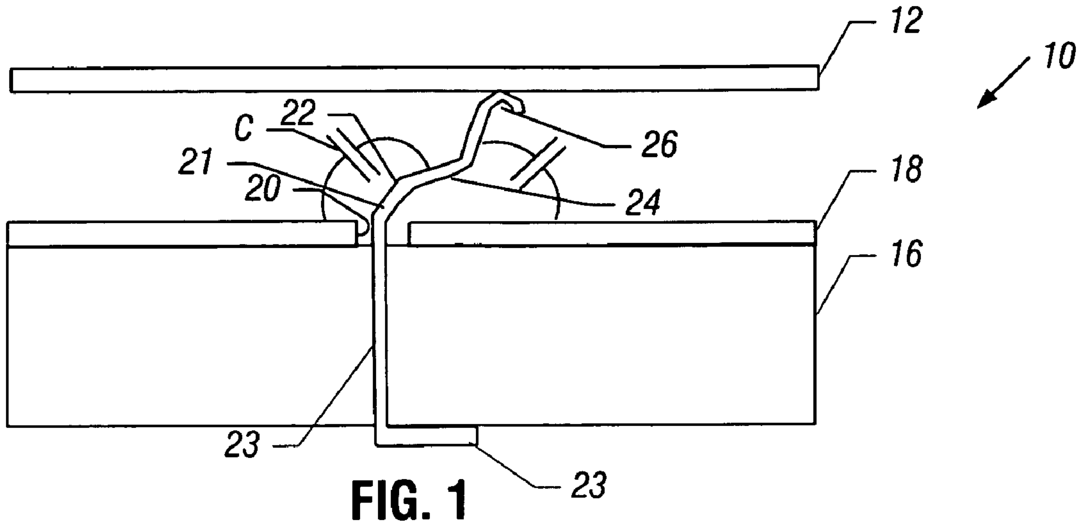
FIG. 1 is an enlarged, partial cross-sectional view of one embodiment of the present invention.

Referring to FIG. 1, a package assembly 10 includes an LGA package 12 coupled by contacts 22 to a socket 16. The embedded conductive plate 18 is grounded. The socket contact 22 has a land 23 on one end, extends through the conductive plate 18, and has a deformed end 26 over the plate 18 that spring contacts the package 12. The grounded conductive plate 18 has openings 20 to allow contacts 22 to pass through. Capacitance C arises between a contact 22 and the grounded conductive plate 18 as indicated in FIG. 1.

The conductive plate 18 provides capacitive coupling to each contact 22, which may reduce the impedance discontinuity at the socket 16. Morover, coupling between adjacent contact 22 pairs may be improved, enabling use of the socket 16 for differential signaling in some embodiments.

Initially, the electrical properties of the electronic package 12 are identified. The electrical properties of the contacts 22 in the socket 16 are determined. An inductance is determined. A desired impedance between each contact 22 and the conductive plate 18 is determined. The inductance may be fixed for a particular socket. Therefore, by identifying a desired impedance, the capacitance C can be varied to get the desired performance.

The diameter of each hole 20 in the conductive plate 18 is determined to achieve the desired impedance. The diameter of the hole 20 can be varied to vary the capacitance C between the conductive plate 18 and the contact 22. Therefore, knowing a desired impedance, the hole 20 diameter may be set to achieve a particular capacitance C that produces the desired impedance.

For a particular electronic package assembly 10, the desired impedance may be the same for every contact 22 on the socket 16. In this case, the diameter of each hole 20 in the grounded conductive plate 18 may be the same. However, it is possible that different impedances are desired for different contacts 22 on a socket 16 based, for instance, on the size of the contact 22 or the signal evolving from the contact. In this case, the grounded conductive plate 18 may have holes 20 of varying diameters.

A land grid array package 12, which may carry an integrated circuit, may be contacted from below by the deformed end 26. The deformed end 26 may have a curved upper contact portion. The contact 22 may have a generally horizontally deformed portion 24, and a bent section 21 that couples to a vertical section 23. The vertical section 23 may be the portion of the contact 22 that extends through the embedded conductive plate 18. In one embodiment, stamped metal contact land grid array technology may be utilized.

Figure 2:
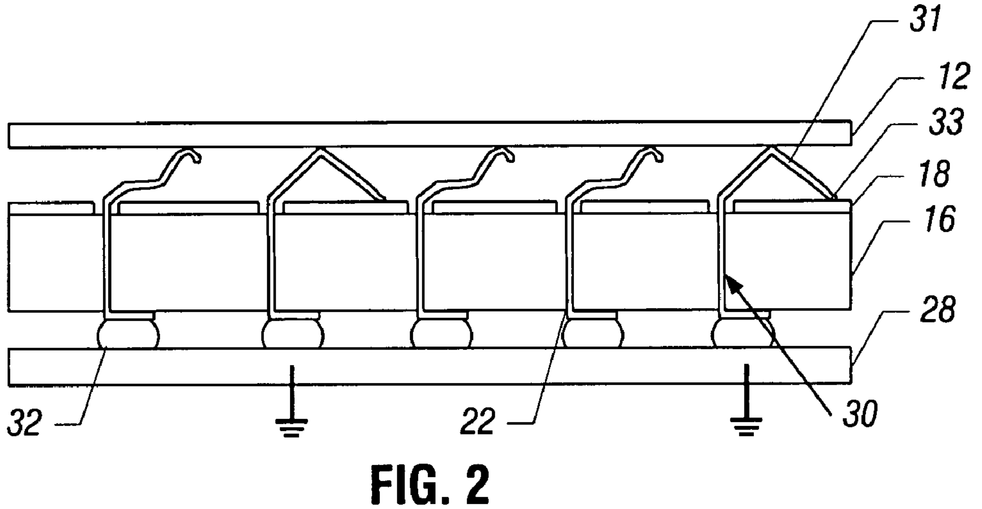
FIG. 2 is an enlarged, cross-sectional view of a socket according to one embodiment of the present invention.

Referring to FIG. 2, the package 12 may be clamped onto the socket 16 in accordance with one embodiment, depressing the contact 22 deformed ends 26. Some of the contacts 22 may be coupled to solder balls 32, which are electrically coupled to a grounded motherboard 28. However, other contacts 30 are of a slightly different configuration. Those contacts 30 may have V-shaped contacting portions 31, which have land surfaces 33, which contact the embedded conductive plate 18 when the package 12 engages the socket 16.

As a result, when the package 12 is pressed onto the socket 16, the deformed ends 26 of the contacts 22 are deformed to make tight spring biased electrical connections to the package 12. However, the contacts 30 deform so that their lands 33 make electrical connection to the embedded conductive plate 18. This connection grounds the embedded conductive plate 18 via solder balls 32 to the grounded motherboard 28.

Figure 3:
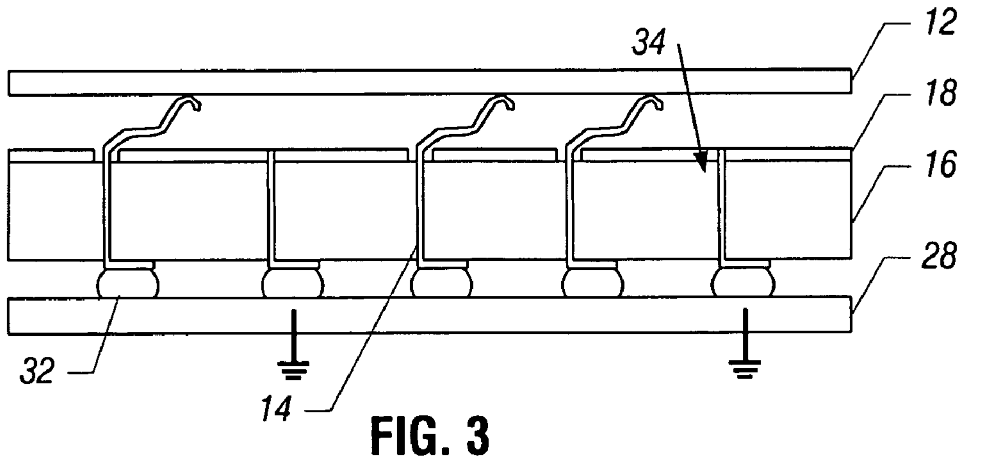
FIG. 3 is an enlarged, cross-sectional view of another embodiment of the present invention.

Referring to FIG. 3, additional contacts 34 may be permanently electrically coupled to the embedded conductive plate 18 in one embodiment. The contacts 34 couple to ground through the motherboard 28 via solder balls 32. Thus, in this embodiment, the metal conductive plate 18 is connected to ground through the motherboard 28.

Figure 4:
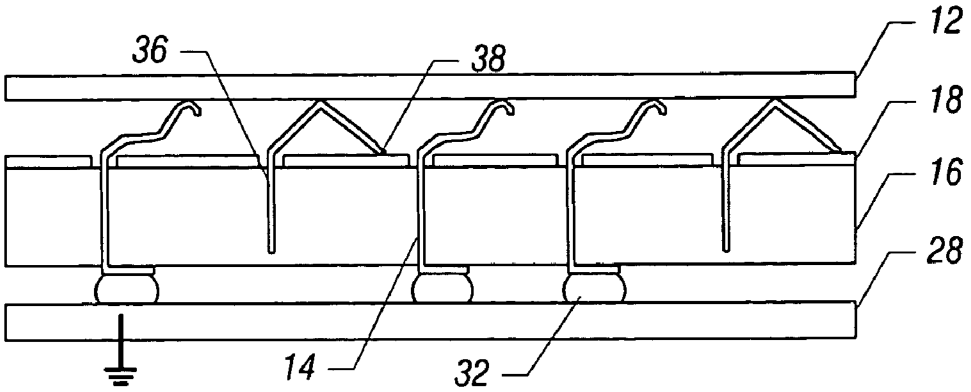
FIG. 4 is an enlarged, cross-sectional view of a socket according to another embodiment of the present invention.

In accordance with still another embodiment, shown in FIG. 4, the socket contacts 36 electrically contact the conductive plate 18 through land ends 38 when the package 12 is pressed onto the socket 16. However, in this case, the socket contacts 36 are floating because they do not ground through the motherboard 28.

Sockets with conductive plates, according to some embodiments of the present invention, may reduce the impedance discontinuity of LGA contacts. Moreover, some embodiments allow extension of present LGA sockets to differential signaling applications. Further, electrical parasitics (inductance and capacitance) may be distributed to avoid potential resonance issues at high frequencies in some cases.

Figure 5:
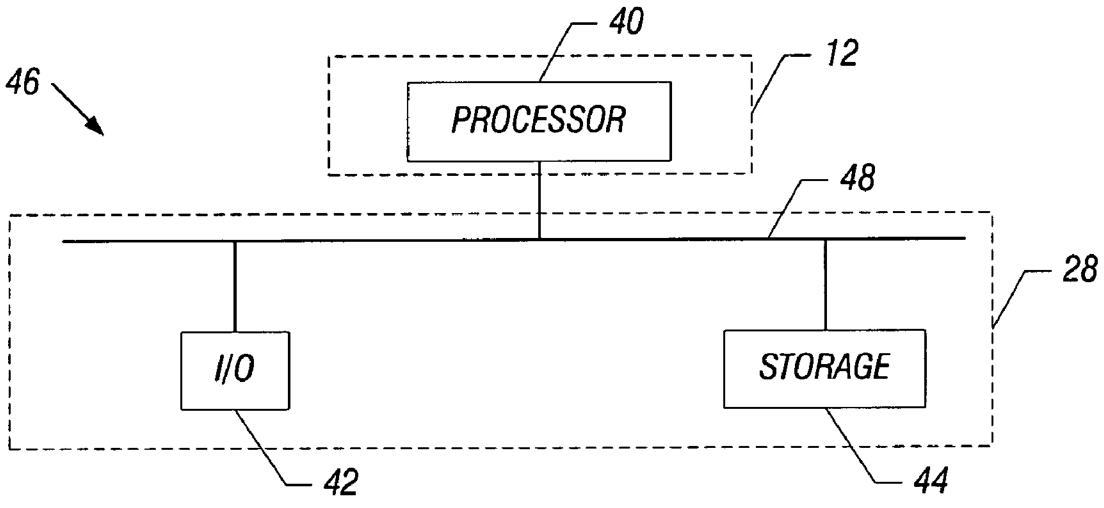
FIG. 5 is a schematic depiction of one embodiment of the present invention.

Referring to FIG. 5, a processor-based system 46 may be a laptop computer, a desk top computer, an entertainment system, a personal digital assistant, a camera, a cellular telephone, to mention a few examples. The system 46 may include a package 12, which includes a processor 40. The processor 40 may be coupled over the motherboard 28 to a bus 48. The bus 48 may in turn be coupled to input/output pads 42 and a storage 44.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

providing capacitance between contacts on a land grid array package and a ground plate in a socket;

providing a contact, having two ends, in the socket, said contact having, on one end, a land and on the other end a spring contact;

providing an electrical connection to ground on a printed circuit board via solder balls that contact the printed circuit board and the land of the contact; and providing additional socket contacts which extend through a conductive plate and over the conductive plate, said additional contacts arranged so that when the package is compressed against the socket the additional contacts make electrical contact to said plate.

2. The method of claim 1 including providing a capacitance between the plate and a contact that extends through a hole in said plate, to balance the inductive discontinuities arising from the socket.

3. The method of claim 1 including using stamped metal contacts.

4. The method of claim 1 including providing additional contacts with land ends connectable by solder balls to the package, said additional contacts being permanently fixed on one end to said plate and connectable on the other end through said lands to the printed circuit board.

5. The method of claim 1 including providing additional contacts which are floating and which have ends that, when deformed by the package, make an electrical connection to said plate.

6. The method of claim 1 including providing holes in said plate to produce a coupling capacitance.

7. The method of claim 6 including forming holes of different diameters.

8. A socket comprising:

a socket base;

a conductive plate over said base;

a plurality of socket pins extending through said plate to contact an integrated circuit package on one end and to make electrical connection to a printed circuit board on the opposite end; and wherein said pins include a spring arm portion that bends down and contacts said plate.

9. The socket of claim 8, said pins pass through openings in said socket plate to develop a capacitance between the plate and the pin.

10. The socket of claim 8 wherein said pins include a spring arm on one end and a land on the opposite end.

11. The socket of claim 8 wherein said pins to develop a capacitance to said plate to balance inductive discontinuities arising from said pin.

12. The socket of claim 8 wherein said pins are stamped metal contacts.

13. The socket of claim 8 including a solder ball on said land.

14. The socket of claim 8 including additional contacts with land ends connectable by solder balls to the package, said additional contacts being permanently fixed on one end to said plate and connectable on the other end through said lands to the printed circuit board.

15. The socket of claim 8 including additional contacts that are floating and that have ends that, when deformed by a package, make an electrical connection to said plate.

16. The socket of claim 8 including a plurality of holes and a plurality of contacts extending through said holes, said holes being of different diameters.

17. An electronic device comprising:

a land grid array package;

a printed circuit board;

a socket coupling said package to said printed circuit board, said socket including a socket base, a conductive plate over said base and under said package, and a plurality of socket pins extending through said plate to contact said integrated circuit package on one end and to make electrical connection to said printed circuit board on the opposite end; and additional contacts that are floating and that have ends that make an electrical connection to said plate.

18. The device of claim 17, wherein said contacts pass through openings in said socket plate to develop a capacitance between the plate and the contact.

19. The device of claim 17 wherein said contacts include a spring arm on one end and a land on the opposite end.

20. The device of claim 17 wherein said contacts to develop a capacitance to said plate to balance inductive discontinuities arising from said contacts.

21. The device of claim 17 wherein said contacts are stamped metal contacts.

22. The device of claim 17 wherein said contacts have lands and solder balls couple said lands to said printed circuit board.

23. The device of claim 17 wherein said contacts include spring arm portions that bend down and contact said plate.

24. The device of claim 17 including additional contacts with land ends connectable by solder balls to the package, said additional contacts being permanently fixed on one end to said plate and connected on the other end through said lands to said printed circuit board.

25. The device of claim 17 including a plurality of holes and a plurality of contacts extending through said holes, said holes being of different diameters.

26. A method comprising:

providing capacitance between contacts on a land grid array package and a ground plate in a socket;

providing a contact, having two ends, in the socket, said contact having, on one end, a land and onto other end a spring contact;

providing an electrical connection to ground on a printed circuit board via solder balls that contact the printed circuit board and the land of the contact; and providing additional contacts with land ends connectable by solder balls to the package, said additional contacts being permanently fixed on one end to said plate and connectable on the other end through said lands to the printed circuit board.

27. The method of claim 26 including providing additional socket contacts which extend through the conductive plate and over the conductive plate, said additional contacts arranged so that when the package is compressed against the socket, the additional contacts make electrical contact to said plate.

28. The method of claim 26 including providing additional contacts which are floating and which have ends that, when deformed by the package, make an electrical connection to said plate.

29. A method comprising:

providing capacitance between contacts on a land grid array package and a ground plate in a socket;

providing a contact, having two ends, in the socket, said contact having, on one end, a land and on the other end a spring contact;

providing an electrical connection to ground on a printed circuit board via solder balls that contact the printed circuit board and the land of the contact; and providing additional contacts which are floating and which have ends that, when deformed by the package, make an electrical connection to said plate.

30. The method of claim 29 including providing additional socket contacts which extend through the conductive plate and over the conductive plate, said additional contacts arranged so that when the package is compressed against the socket, the additional contacts make electrical contact to said plate.

31. The method of claim 30 including providing additional contacts with land ends connectable by solder balls to the package, said additional contacts being permanently fixed on one end to said plate and connectable on the other end through said lands to the printed circuit board.

32. A socket comprising:

a socket base;

a conductive plate over said base;

a plurality of socket pins extending through said plate to contact an integrated circuit package on one end and to make electrical connection to a printed circuit board on the opposite end; and additional contacts that are floating and that have ends that, when deformed by a package, make an electrical connection to said plate.

33. The socket of claim 32 wherein said contacts include a spring arm portion that bends down and contacts said plate.

34. An electronic device comprising:

a land grid array package;

a printed circuit board;

a socket coupling said package to said printed circuit board, said socket including a socket base, a conductive plate over said base and under said package, and a plurality of socket pins extending through said plate to contact said integrated circuit package on one end and to make electrical connection to said printed circuit board on the opposite end; and wherein said pins include spring arm portions that bend down and contact said plate.

35. The device of claim 34 including additional contacts that are floating and that have ends that make an electrical connection to said plate.

* * * * *

UNITED STATES PATENT AND TRADEMARK OFFICE

CERTIFICATE OF CORRECTION

PATENT NO. : 7,114,959 B2 
APPLICATION NO. : 10/925451
DATED : October 3, 2006
INVENTOR(S) : Brent S. Stone and Joel A. Auernheimer It is certified that error appears in the above-identified patent and that said Letters Patent is hereby corrected as shown below:

Column 5:
Line 8, “onto” should be --on the--.

Signed and Sealed this

Second Day of January, 2007

JON W. DUDAS
*Director of the United States Patent and Trademark Office*